United States Patent
Cho

(10) Patent No.: US 8,766,397 B2
(45) Date of Patent: Jul. 1, 2014

(54) OPTOELECTRONIC INTEGRATED CIRCUIT SUBSTRATE AND METHOD OF FABRICATING THE SAME

(75) Inventor: Seong-ho Cho, Gwacheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 35 days.

(21) Appl. No.: 13/362,144

(22) Filed: Jan. 31, 2012

(65) Prior Publication Data

US 2013/0037907 A1 Feb. 14, 2013

(30) Foreign Application Priority Data

Aug. 12, 2011 (KR) .................. 10-2011-0080649

(51) Int. Cl.
*H01L 27/12* (2006.01)
(52) U.S. Cl.
USPC ........................................ 257/506
(58) Field of Classification Search
USPC ................ 257/348, 415, 506, 635, 637
See application file for complete search history.

(56) References Cited

U.S. PATENT DOCUMENTS

| 6,197,656 | B1 | 3/2001 | Adkisson et al. |
| 6,664,146 | B1 | 12/2003 | Yu |
| 2002/0142507 | A1 | 10/2002 | Egashira |
| 2004/0150067 | A1* | 8/2004 | Ghyselen et al. ............. 257/506 |
| 2005/0090080 | A1 | 4/2005 | Fogel et al. |
| 2007/0087514 | A1 | 4/2007 | Hamamoto |
| 2010/0140708 | A1* | 6/2010 | Hill et al. ........................ 257/348 |
| 2011/0266651 | A1 | 11/2011 | Riou et al. |
| 2013/0114924 | A1* | 5/2013 | Loh et al. ........................ 385/14 |

FOREIGN PATENT DOCUMENTS

| EP | 1 246 248 A2 | 10/2002 |
| FR | 2 942 568 A1 | 8/2010 |
| JP | 2008-244042 A | 10/2008 |
| KR | 20020067774 A | 8/2002 |
| KR | 2002-0094003 A | 12/2002 |
| KR | 20040107377 A | 12/2004 |
| KR | 20060094858 A | 8/2006 |
| WO | WO-2004/044975 A1 | 5/2004 |

OTHER PUBLICATIONS

J.S. Orcutt, et al., "Nanophotonic integration in state-of-the-art CMOS foundries," Optics Express, vol. 19, No. 3, pp. 2335-2346 (Jan. 31, 2011).
N. Sherwood-Droz, et al., "Oxidized Silicon-On-Insulator (OxSOI) from bulk silicon: a new photonic platform," Optics Express, vol. 18, No. 6, pp. 5785-5790 (Mar. 15, 2010).
European Search Report for corresponding European Application No. Ep 12 160 834, dated Feb. 19, 2014.

\* cited by examiner

*Primary Examiner* — Thomas L Dickey
(74) *Attorney, Agent, or Firm* — Harness, Dickey & Pierce, P.L.C.

(57) ABSTRACT

An optoelectronic integrated circuit substrate may include a first region and a second region. The first region and the second region each include at least two buried insulation layers having different thicknesses. The at least two buried insulation layers of the first region are formed at a greater depth and have a greater thickness as compared to the at least two buried insulation layers of the second region. A microelectromechanical systems (MEMS) structure may be formed in a third region that does not include a buried insulation layer.

10 Claims, 11 Drawing Sheets

OPTOELECTRONIC INTEGRATED CIRCUIT SUBSTRATE AND METHOD OF FABRICATING THE SAME

CROSS-REFERENCE TO RELATED APPLICATIONS

This application claims the benefit of Korean Patent Application No. 10-2011-0080649, filed on Aug. 12, 2011 in the Korean Intellectual Property Office, the disclosures of which are incorporated herein in their entirety by reference.

BACKGROUND

1. Field

Example embodiments relate to substrates suitable for embodying optical devices, electronic devices, and micro-electromechanical systems (MEMS) structure together and methods of fabricating the same.

2. Description of the Related Art

Semiconductor integrated circuits employ electronic communication to electronically transmit and receive data. Semiconductor integrated circuits are integrated on a printed circuit board (PCB) and electronically communicate with each other via wires. There are limits in reducing the electrical resistances between semiconductor integrated circuits. Furthermore, electronic communication may be affected by external electronic waves. Due to such reasons, increasing the communication speed between semiconductor integrated circuits may be difficult.

Recently, optical interconnection or optical communication is employed to increase the communication speed between semiconductor integrated circuits. Optical communication includes transmission and/or reception of optical signals including data. Compared to electronic communication, optical communication may result in less interference by external electronic waves and enables faster communication.

For optical communication between semiconductor integrated circuits, embodying an optical device in a semiconductor integrated circuit may be necessary. Furthermore, a region for arranging optical fibers for optical communication and a micro-electromechanical systems (MEMS) region for forming an MEMS structure may be required.

To embody an optical device and an electronic device together on the same substrate, a silicon on insulator (SOI) substrate may be employed. An SOI substrate includes a buried oxide layer on a substrate and an epitaxial layer thereon. The buried oxide layer is located at a predetermined or given depth from a surface of the SOI substrate and has a predetermined or given thickness.

However, the thicknesses of an epitaxial layer and a buried oxide layer suitable for an optical device differ from those suitable for an electronic device, and a region requiring an MEM structure may be a region without a buried oxide layer.

SUMMARY

Example embodiments provide an optoelectronic integrated circuit substrate including an optical device region and an electronic device region, each including a buried insulation layer having different thicknesses from each other. Example embodiments also provide a method of fabricating the optoelectronic integrated circuit.

Additional aspects will be set forth in part in the description which follows and, in part, will be apparent from the description, or may be learned by practice of example embodiments.

According to example embodiments, an optoelectronic integrated circuit substrate may include a first region and a second region. The first region may include a buried insulation layer having a first thickness and the second region may include a buried insulation layer having a second thickness different from the first thickness.

The optoelectronic integrated circuit substrate may further include a third region having no buried insulation layer. A micro-electromechanical systems (MEMS) structure may be formed in the third region. The buried insulation layer may be formed through implantation of at least one selected from a group consisting of oxygen, nitrogen, and neon. A top surface of the buried insulation layer of the first region and a top surface of the buried insulation layer of the second region may be at different heights in a vertical direction.

The optoelectronic integrated circuit substrate may further include optical devices on the first region, and electronic devices on the second region. The buried insulation layer of the first region may be thicker than the buried insulation layer of the second region. A top surface of the buried insulation layer of the first region may be at a lower height than a top surface of the buried insulation layer of the second region. The buried insulation layer of the first region may have a thickness from about 0.5 μm to about 3 μm at a depth from about 100 nm to about 500 nm from a top surface of the optoelectronic integrated circuit substrate, and the buried insulation layer of the second region may have a thickness from about 5 nm to about 300 nm at a depth from about 1 nm to about 100 nm from the top surface of the optoelectronic integrated circuit substrate.

The optoelectronic integrated circuit substrate may further include a fourth region including a buried insulation layer formed at a first depth. The buried insulation layer of the first region may be formed at a second depth less than the first depth.

The buried insulation layer of the first region may be located from about 100 nm to about 200 nm from the top surface of the optoelectronic integrated circuit substrate, and the buried insulation layer of the fourth region may be located from about 300 nm to about 500 nm from the top surface of the optoelectronic integrated circuit substrate. The first region and the fourth region may be optical device regions.

The optoelectronic integrated circuit substrate may include one of a conductive polymer and a semiconductor selected from a group consisting of silicon, gallium arsenide, and indium phosphide.

According to example embodiments, a method of fabricating an optoelectronic integrated circuit substrate may include defining a first region and a second region in a substrate, forming a first ion implantation layer in the first region by implanting ions in the substrate to a first depth, the first ion implantation layer having a first thickness, forming a second ion implantation layer in the second region by implanting ions in the substrate to a second depth, the second ion implantation layer having a second thickness, and thermally treating the substrate in order to form a first buried insulation layer and a second buried insulation layer from the first ion implantation layer and the second ion implantation layer, respectively.

The method may further include forming optical devices on the first region, and forming electronic devices on the second region. The first buried insulation layer may be thicker than the second buried insulation layer. The method may further include forming a first epitaxial layer above the first buried insulation layer, the first epitaxial layer having a first thickness, and a second epitaxial layer above the second buried insulation layer, the second epitaxial layer having a second thickness less than the first thickness.

The method may further include defining a micro-electromechanical systems (MEMS) region in the substrate, the MEMS region having an MEMS structure formed thereon. Ions may not be implanted in the MEMS region.

The first thickness of the first epitaxial layer above the first buried insulation layer may be from about 100 nm to about 500 nm, and the first thickness of the first ion implantation layer may be from about 0.5 μm to about 3 μm. The second thickness of the second epitaxial layer above the second buried insulation layer may be from about 1 nm to about 100 nm, and the second thickness of the second ion implantation layer may be from about 5 nm to about 300 nm.

The optoelectronic integrated circuit substrate may include one of a conductive polymer and a semiconductor selected from a group consisting of silicon, gallium arsenide, and indium phosphide. The ions may be selected from a group consisting of oxygen ions, nitrogen ions, and neon ions.

The method may further include forming a third ion implantation layer by implanting ions into the substrate to a third depth in the first region, the third ion implantation layer having a third thickness. Thermally treating the substrate may include forming a third buried insulation layer from the third ion implantation layer. The first depth and the third depth may be greater than the second depth, and the first thickness and the third thickness may be greater than the second thickness.

The method may further include forming a first epitaxial layer above the first buried insulation layer, the first epitaxial layer having a first thickness from about 100 nm to about 200 nm, and forming a third epitaxial layer above the third buried insulation layer, the third epitaxial layer having a third thickness from about 300 nm to about 500 nm. The first thickness and the third thickness may be from about 0.5 μm to about 3 μm.

The method may further include defining a micro-electromechanical systems (MEMS) region in the substrate, the MEMS region having an MEMS structure formed thereon, and ions may not be implanted in the MEMS region.

An optoelectronic integrated circuit substrate according to example embodiments may provide a substrate desirable for both optical devices and electronic devices. Furthermore, because no buried oxide layer is formed in an MEMS region, an MEMS device may be easily formed. Furthermore, a substrate in which buried oxide layers are formed for various types of optical devices may be provided.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
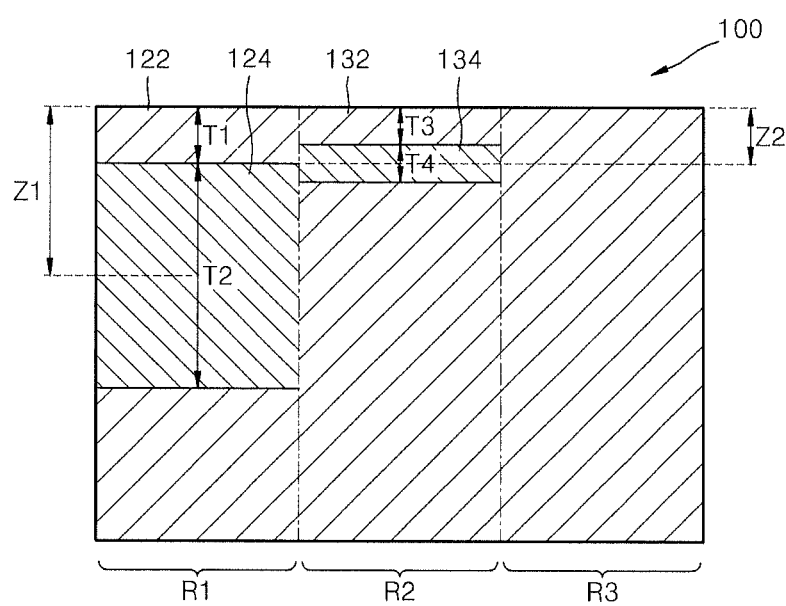
FIG. 1 is a schematic sectional view of an optoelectronic integrated circuit substrate according to example embodiments.

Reference will now be made in detail to example embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects of the present description.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic sectional view of an optoelectronic integrated circuit substrate 100 according to example embodiments. Referring to FIG. 1, the optoelectronic integrated circuit substrate 100 includes an optical device region R1, an electronic device region R2, and a micro-electromechanical systems (MEMS) region R3. The optoelectronic integrated circuit substrate 100 shown in FIG. 1 may be a substrate forming a single chip region to be diced from a wafer.

The optoelectronic integrated circuit substrate 100 may be formed of silicon, gallium arsenide, indium phosphide, or a conductive polymer. Hereinafter, it is assumed that the optoelectronic integrated circuit substrate 100 is formed of silicon.

Optical devices are arranged on the optical device region R1, electronic devices are arranged on the electronic device region R2, and an MEMS structure is arranged on the MEMS region R3. The optical devices, the electronic devices, and the MEMS structure may be formed on the optoelectronic integrated circuit substrate 100 via semiconductor processes or by arranging separate circuit chips on the optoelectronic integrated circuit substrate 100.

Buried oxide layers may be formed in the optical device region R1 and the electronic device region R2, but not in the MEMS region R3. Depths and thicknesses of buried oxide layers in the optical device region R1 and the electronic device region R2 may be different from each other.

In the optical device region R1, a first silicon epitaxial layer 122 may be formed in the optoelectronic integrated circuit substrate 100 to have a first thickness T1 from a surface of the optoelectronic integrated circuit substrate 100, and a first silicon buried oxide layer 124 having a second thickness T2 may be formed below the first silicon epitaxial layer 122 at a first depth Z1 from the surface of the optoelectronic integrated circuit substrate 100. The first silicon buried oxide layer 124 may be formed via oxygen implantation. The first thickness T1 is from about 100 nm to about 500 nm. If the first thickness T1 is less than 100 nm, confining a light guide may be difficult, and thus light leakage may occur. If the first thickness T1 is greater than 500 nm, the volume of the light guide increases, and thus the size of an optical device also increases. Examples of optical devices may include a laser, a light-emitting diode, an optical modulator, an optical multiplexer/demultiplexer, a photodiode, and a waveguide.

The second thickness T2 may be from about 0.5 μm to about 3 μm. If the second thickness T2 is less than 0.5 μm, light may not be confined due to light leakage, and thus, propagation loss may increase. If the second thickness T2 is greater than 3 μm, the size of an optical device may increase.

In the electronic device region R2, a second silicon epitaxial layer 132 may be formed in the optoelectronic integrated circuit substrate 100 to have a third thickness T3 from a surface of the optoelectronic integrated circuit substrate 100, and a second silicon buried oxide layer 134 having a fourth thickness T4 may be formed below the second silicon epitaxial layer 132 at a second depth Z2 from the surface of the optoelectronic integrated circuit substrate 100. The second silicon buried oxide layer 134 may be formed via oxygen implantation. The third thickness T3 is from about 1 nm to about 100 nm. The third thickness T3 may vary according to the design of electronic devices or a channel length of a transistor. If the third thickness T3 is less than 1 nm, forming a channel path for electrons may be difficult. If the third thickness T3 is greater than 100 nm, parasitic capacitance may increase, and thus high-speed operations of electronic devices may be difficult to perform. The electronic devices may include a transistor and/or a diode.

The fourth thickness T4 may be from about 5 nm to about 300 nm. If the fourth thickness T4 is less than 5 nm, charge leakage may occur, and thus high-speed operations of an electronic circuit may be difficult to perform. If the fourth thickness T4 is greater than 300 nm, heat radiation efficiency of an electronic circuit may decrease and parasitic capacitance may increase, and thus high-speed operations of electronic devices may be difficult to perform.

In the MEMS region R3, a buried oxide layer may not be formed. The MEMS region R3 may be partially etched and optical fibers may be arranged in the etched region. Furthermore, the MEMS region R3 may be etched to become a region in which a cantilever structure and an acceleration sensor may be formed. Therefore, a buried oxide layer may not be formed to allow for an easier etching process.

The optoelectronic integrated circuit substrate 100 according to example embodiments may provide desirable silicon on insulator (SOI) substrates for both optical devices and electronic devices. Furthermore, because no buried oxide layer is formed in the MEMS region R3, an MEMS device may be more easily formed.

Although oxygen ions are used for forming a buried oxide layer, example embodiments are not limited thereto. For example, a buried insulation layer may be formed in a substrate by using nitrogen and/or neon.

Figure 2:
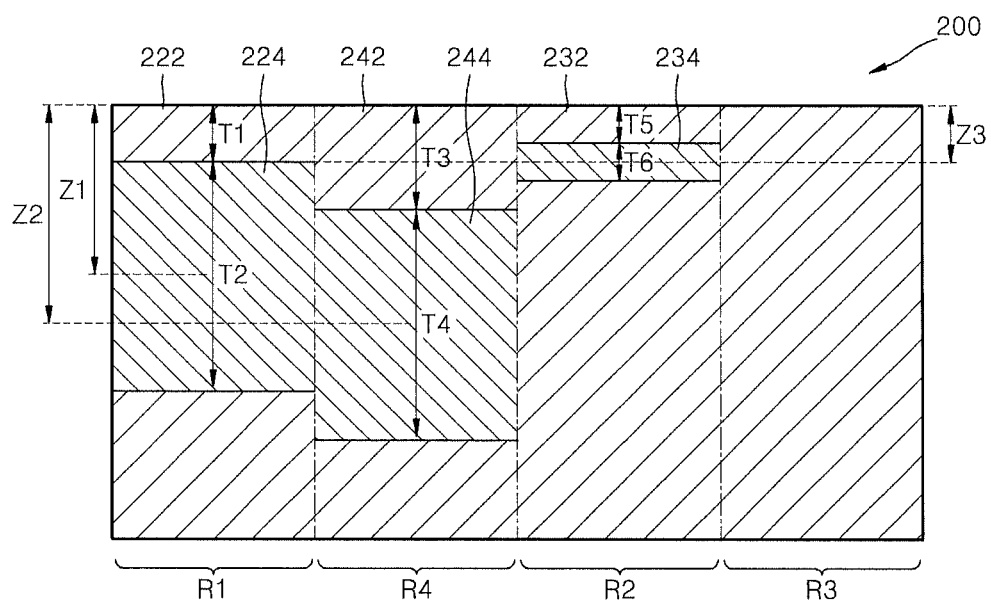
FIG. 2 is a schematic sectional view of an optoelectronic integrated circuit substrate according to example embodiments.

FIG. 2 is a schematic sectional view of an optoelectronic integrated circuit substrate 200 according to example embodiments. Components shown in FIG. 2 that are substantially same as the components shown in FIG. 1 are indicated by the same reference numerals and detailed descriptions thereof will be omitted.

Referring to FIG. 2, the electronic optical integrated circuit substrate 200 includes optical device regions R1 and R4, the electronic device region R2, and the MEMS region R3. The optoelectronic integrated circuit substrate 200 shown in FIG. 2 may be a substrate forming a single chip region to be diced from a wafer.

The optoelectronic integrated circuit substrate 200 may be formed of silicon, gallium arsenide, indium phosphide, or a conductive polymer. Hereinafter, it is assumed that the optoelectronic integrated circuit substrate 200 is formed of silicon.

Optical devices are arranged on the optical device regions R1 and R4, electronic devices are arranged on the electronic device region R2, and an MEMS structure is arranged on the MEMS region R3. The optical devices, the electronic device, and the MEMS structure may be formed on the optoelectronic integrated circuit substrate 200 via semiconductor processes or by arranging separate circuit chips on the optoelectronic integrated circuit substrate 200.

Buried oxide layers may be formed in the optical device regions R1 and R4 and the electronic device region R2, but not in the MEMS region R3. Depths and thicknesses of buried oxide layers in the optical device regions R1 and R4 and the electronic device region R2 may be different from each other.

In the optical device region R1, a first silicon epitaxial layer 222 may be formed in the optoelectronic integrated circuit substrate 200 to have a first thickness T1 from a surface of the optoelectronic integrated circuit substrate 200, and a first silicon buried oxide layer 224 having a second thickness T2 may be formed below the first silicon epitaxial layer 222 at a first depth Z1 from the surface of the optoelectronic integrated circuit substrate 200. The first buried oxide layer 224 may be formed via oxygen implantation. The first thickness T1 is from about 100 nm to about 200 nm. If the first thickness T1 is less than 100 nm, confining a light guide may be difficult, and thus light leakage may occur. In the optical device region R1, optical devices with relatively small optical traverse modes may be formed. The second thickness T2 may be from about 0.5 μm to about 3 μm.

In the optical device region R4, a second silicon epitaxial layer 242 may be formed in the optoelectronic integrated circuit substrate 200 to have a third thickness T3 from the surface of the optoelectronic integrated circuit substrate 200, and a second silicon buried oxide layer 244 having the fourth thickness T4 may be formed below the second silicon epitaxial layer 242 at a second depth Z2 from the surface of the optoelectronic integrated circuit substrate 200. The second buried oxide layer 244 may be formed via oxygen implantation. The third thickness T3 is from about 300 nm to about 500 nm. If the third thickness T3 is greater than 500 nm, the volume of the light guide increases, and thus, a size of an optical device also increases. Examples of optical devices may include a laser, a light-emitting diode, an optical modulator, optical multiplexer/demultiplexer, a photodiode and/or a waveguide.

The fourth thickness T4 may be from about 0.5 μm to about 3 μm. If the fourth thickness T4 is less than 0.5 μm, light may not be confined due to light leakage. If the fourth thickness T4 is greater than 3 μm, the size of an optical device may increase. In the electronic device region R2, a third silicon epitaxial layer 232 may be formed in the optoelectronic integrated circuit substrate 200 to have a fifth thickness T5 from the surface of the optoelectronic integrated circuit substrate 200, and a third silicon buried oxide layer 234 having a sixth thickness T6 may be formed below the third silicon epitaxial layer 232 at a third depth Z3 from the surface of the optoelectronic integrated circuit substrate 200. The third buried oxide layer 234 may be formed via oxygen implantation. The fifth thickness T5 may be from about 1 nm to about 100 nm. If the fifth thickness T5 is less than 1 nm, forming a channel path for electrons may be difficult. If the fifth thickness T5 is greater than 100 nm, parasitic capacitance may increase, and thus, high-speed operations of electronic devices may be difficult to perform. The electronic devices may include a transistor, a resistor, an inductor, a capacitor and/or a diode.

The sixth thickness T6 may be from about 5 nm to about 300 nm. If the sixth thickness T6 is less than 5 nm, charge leakage may occur, and thus, high-speed operations of an electronic circuit may be difficult to perform. If the sixth thickness T6 is greater than 300 nm, heat radiation efficiency of an electronic circuit may decrease and parasitic capacitance may increase. Thus, high-speed operations of electronic devices may be difficult to perform. The sixth thickness T6 may vary according to the design of electronic devices or a channel length of a transistor.

In the MEMS region R3, no buried oxide layer may be formed. The MEMS region R3 may be partially etched and optical fibers may be arranged in the etched region. Furthermore, the MEMS region R3 may be etched to become a region in which a cantilever structure and an acceleration sensor may be formed. Therefore, a buried oxide layer may not be formed for an easier etching process.

Although FIG. 2 shows the two optical device regions R1 and R4 for forming optical devices, example embodiments are not limited thereto. In other words, an optoelectronic integrated circuit substrate according to example embodiments may include a plurality of optical device regions having differently located buried oxide layers.

The optoelectronic integrated circuit substrate 200 according to example embodiments may provide desirable SOI substrates for both optical devices and electronic devices. Particularly, the optoelectronic integrated circuit substrate 200 provides two optical device regions for various optical devices. Furthermore, because no buried oxide layer is formed in the MEMS region R3, a MEMS device may be easily formed.

Although oxygen ions are used for forming a buried oxide layer, example embodiments are not limited thereto. For example, a buried insulation layer may be formed in a substrate by using nitrogen or neon.

Figure 3A:
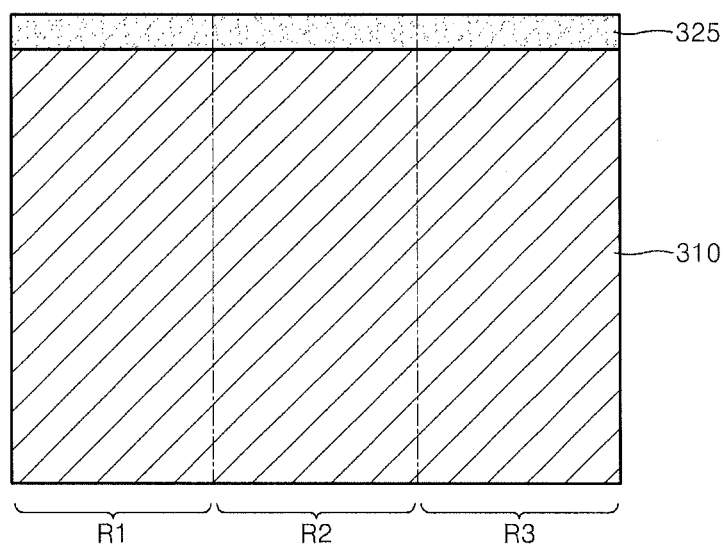
FIGS. 3A through 3D are diagrams for describing a method of fabricating an optoelectronic integrated circuit substrate according to example embodiments.

FIGS. 3A through 3D are diagrams for describing a method of fabricating an optoelectronic integrated circuit substrate 300 according to example embodiments. Referring to FIG. 3A, a wafer is provided. The wafer includes a plurality of chip regions. In FIGS. 3A through 3D, regions included in a single chip region are shown, where the single chip region is referred to hereinafter as a substrate 310.

The substrate 310 may be formed of silicon, gallium arsenide, indium phosphide, or a conductive polymer. Hereinafter, it is assumed that the substrate 310 is formed of silicon. First, in the silicon substrate 310, the optical device region R1 in which optical devices are to be formed, the electronic device region R2 in which electronic devices are to be formed, and the MEMS region R3 in which an MEMS structure is to be formed may be defined.

A first photoresist layer 325 having a thickness from about 1 μm to about 20 μm may be formed onto the silicon substrate 310. The thickness of the first photoresist layer 325 may vary according to photoresist materials. The thickness of the first photoresist layer 325 may be sufficient to prevent or inhibit ions from being transmitted through the first photoresist layer 325 in an implantation operation described below. The ions may be oxygen ions, nitrogen ions and/or neon ions. Hereinafter, it is assumed that oxygen ions are used.

Figure 3B:
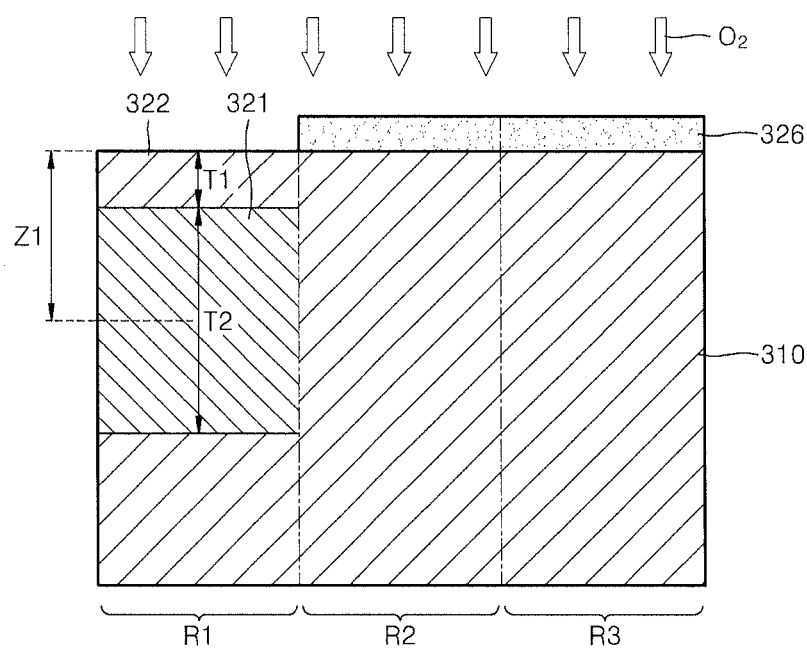

Referring to FIG. 3B, a first pattern 326 may be formed by performing a common photographic etching on the first photoresist layer 325. The first pattern 326 may be formed to expose the optical device region R1.

Oxygen ion implantation may be performed on the first pattern 326 by using an ion implanter. Conditions for the ion implantation may include an energy value from about 30 KeV to about 3000 KeV and an oxygen ion concentration from about $1\times10^{17}$ cm$^{-2}$ to about $1\times10^{19}$ cm$^{-2}$. A first ion implantation layer 321 may be formed in portions of the silicon substrate 310, in which the first pattern 326 is not formed, at a first depth Z1 from a surface of the silicon substrate 310. Optical devices may be formed on the first ion implantation layer 321.

In the optical device region R1, a first silicon epitaxial layer 322 may be formed in the silicon substrate 310 to have the first thickness T1 from the surface of the silicon substrate 310, and the first ion implantation layer 321 having the second thickness T2 may be formed at the first depth Z1. The first thickness T1 is from about 100 nm to about 500 nm. If the first thickness T1 is less than 100 nm, confining a light guide may be difficult, and thus, light leakage may occur. If the first thickness T1 is greater than 500 nm, the volume of the light guide increases, and thus, a size of an optical device also increases.

The second thickness T2 may be from about 0.5 μm to about 3 μm. If the second thickness T2 is greater than a length in which ions propagate in the depth-wise direction during ion implantation, a desired thickness may be acquired by performing a plurality of ion implantations with different ion implanting energies.

Figure 3C:
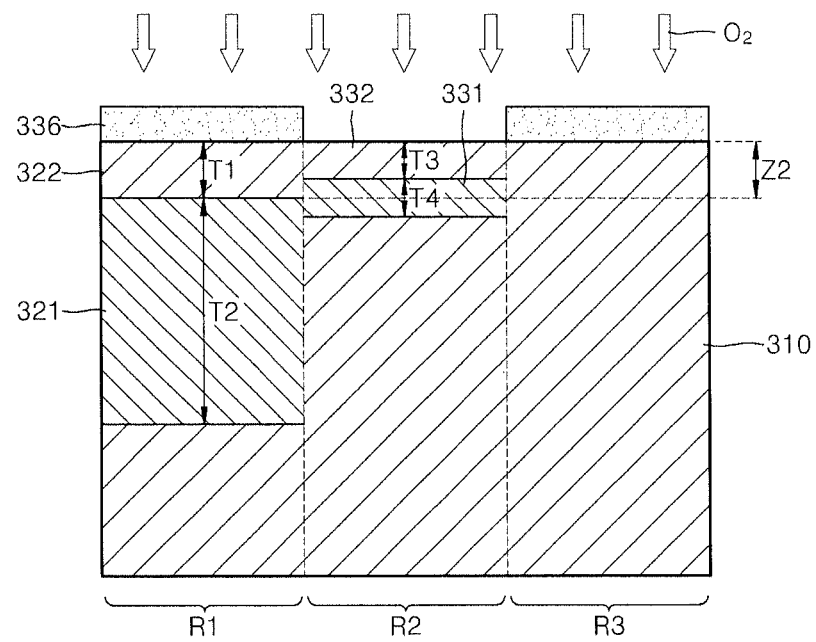

Referring to FIG. 3C, after the first pattern 326 is removed, a second photoresist layer (not shown) having a thickness from about 1 μm to about 20 μm may be formed on the silicon substrate 310. The thickness of the second photoresist layer may vary according to photoresist materials. The thickness of the second photoresist layer may be sufficient to prevent or inhibit oxygen ions from being transmitted through the second photoresist layer in an oxygen implantation operation described below.

A second pattern 336 may be formed by performing a common photographic etching on the second photoresist layer. The second pattern 336 may be formed to expose the electronic device region R2 and cover the optical device region R1 and the MEMS region R3.

Oxygen ion implantation may be performed on the second pattern 336 by using an ion implanter. A second ion implantation layer 331 may be formed in a portion of the silicon substrate 310, on which the second pattern 336 is not formed, at a second depth Z2 from a surface of the silicon substrate 310. Here, conditions for the ion implantation may include an energy value from about 1 KeV to about 100 KeV and an oxygen ion concentration from about $1 \times 10^{17}$ cm$^{-2}$ to about $1 \times 10^{19}$ cm$^{-2}$.

In the electronic device region R2, a second silicon epitaxial layer 332 having the third thickness T3 is formed from the surface of the substrate 310, and the second ion implantation layer 331 having the fourth thickness T4 may be formed at a second depth Z2 from the surface of the substrate 310. The third thickness T3 may be from about 1 nm to about 100 nm. If the third thickness T3 is less than 1 nm, forming a channel path for electrons may be difficult. If the third thickness T3 is greater than 100 nm, parasitic capacitance may increase, and thus, high-speed operations of electronic devices may be difficult to perform. The fourth thickness T4 may be from about 5 nm to about 300 nm.

Figure 3D:
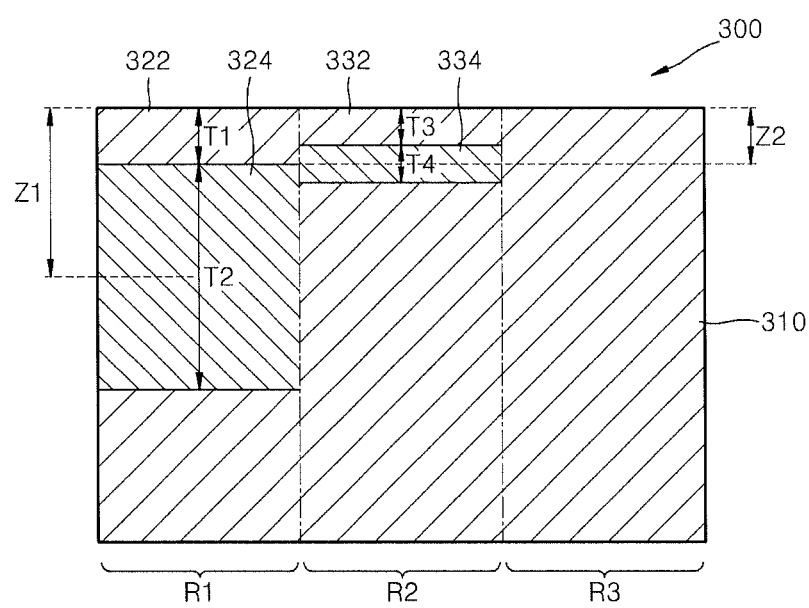

Referring to FIG. 3D, after the second pattern 336 is removed, the substrate 310 may be thermally treated. The thermal treatment may be performed at a temperature from about 1200° C. to about 1500° C. for a period of time from about 10 minutes to about 5 hours. During the thermal treatment, the first ion implantation layer 321 and the second ion implantation layer 331 may become a first silicon oxide film 324 and a second silicon oxide film 334, respectively. The first and second silicon oxide films 324 and 334 correspond to the first and second buried oxide layers 124 and 134 of FIG. 1, respectively.

No buried oxide layer may be formed in a portion of the substrate 310 to which ions are not implanted, i.e., the MEMS region R3.

The optoelectronic integrated circuit substrate 300 provides the optical device region R1 for desirable formation of optical devices, the electronic device region R2 for desirable formation of electronic devices, and the MEMS region R3 without a buried oxide layer which interferes with the formation of an MEMS structure.

Although the method described above includes the formation of the second ion implantation layer 331 after the first ion implantation layer 321 is formed, example embodiments are not limited thereto. For example, the second ion implantation layer 331 may be formed before the first ion implantation layer 321 is formed.

Figure 4A:
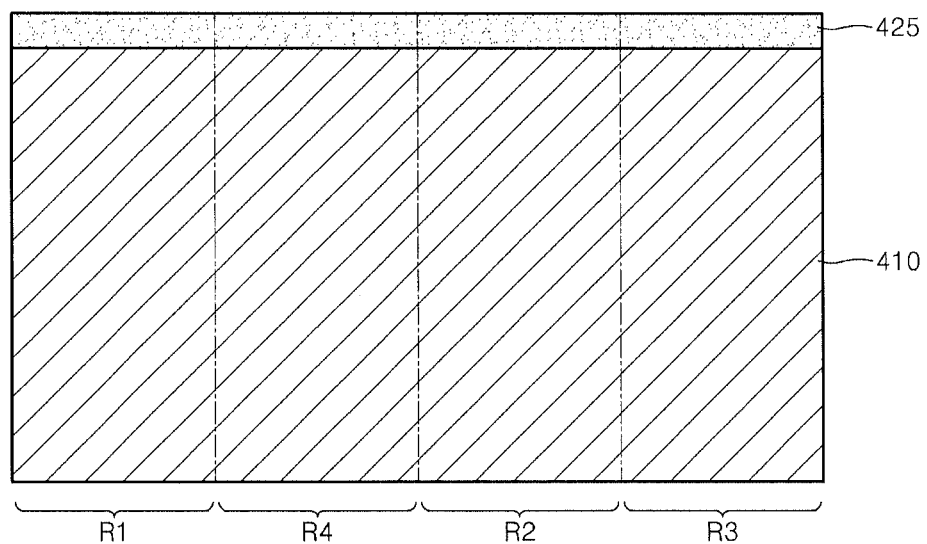
FIGS. 4A through 4E are diagrams for describing a method of fabricating an optoelectronic integrated circuit substrate, according to example embodiments.

FIGS. 4A through 4E are diagrams for describing a method of fabricating an optoelectronic integrated circuit substrate 400, according to example embodiments. Referring to FIG. 4A, a wafer is provided. The wafer includes a plurality of chip regions. In FIGS. 4A through 4D, regions included in a single chip region are shown, where the single chip region is referred to hereinafter as a substrate 410. The substrate 410 may be formed of silicon, gallium arsenide, Indium phosphide and/or a conductive polymer. Hereinafter, it is assumed that the substrate 410 is formed of silicon. First, in the silicon substrate 410, the optical device regions R1 and R4 in which optical devices are to be formed, the electronic device region R2 in which electronic devices are to be formed, and the MEMS region R3 in which an MEMS structure is to be formed may be defined.

A first photoresist layer 425 having a thickness from about 1 μm to about 20 μm may be formed onto the silicon substrate 410. The thickness of the first photoresist layer 425 may vary according to photoresist materials. The thickness of the first photoresist layer 425 may be sufficient to prevent or inhibit ions from being transmitted through the first photoresist layer 425 in an implantation operation described below. The ions may be oxygen ions, nitrogen ions and/or neon ions. Hereinafter, it is assumed that oxygen ions are used.

Figure 4B:
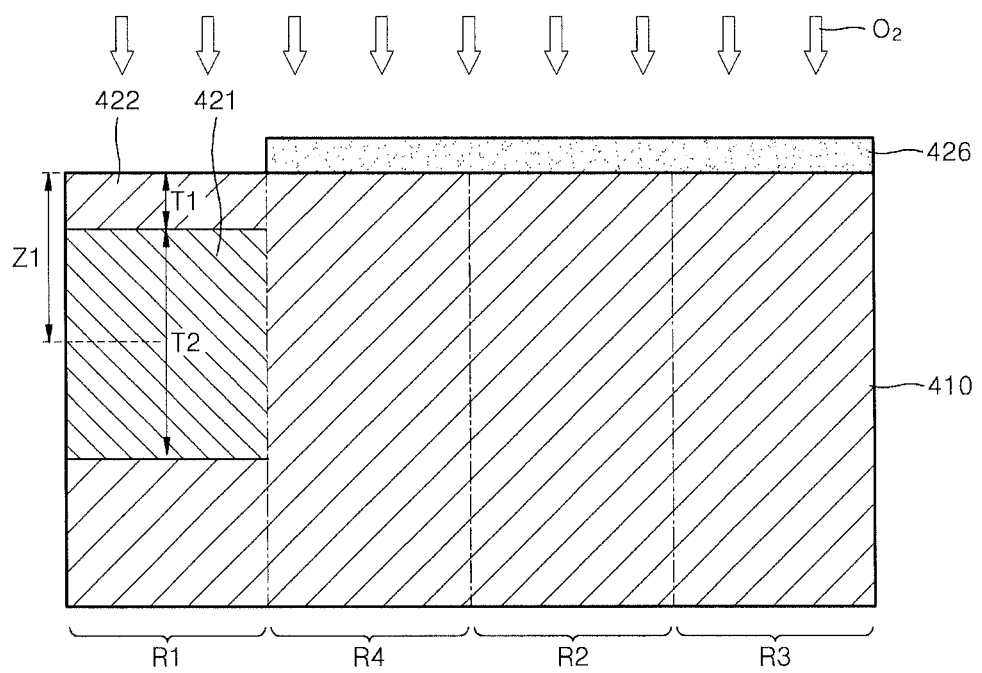

Referring to FIG. 4B, a first pattern 426 may be formed by performing a common photographic etching on the first photoresist layer 425. The first pattern 426 may be formed to expose a first optical device region R1.

Oxygen ion implantation may be performed on the first pattern 426 by using an ion implanter. Conditions for the ion implantation may include an energy value from about 30 KeV to about 3000 KeV and an oxygen ion concentration from about $1 \times 10^{17}$ cm$^{-2}$ to about $1 \times 10^{19}$ cm$^{-2}$. A first ion implantation layer 421 may be formed in portions of the silicon substrate 410, in which the first pattern 426 is not formed, at a first depth Z1 from a surface of the silicon substrate 410. Optical devices may be formed on the first ion implantation layer 421.

In the first optical device region R1, a first silicon epitaxial layer 422 may be formed to have a first thickness T1 from the surface of the substrate 410, and a first ion implantation layer 421 having a second thickness T2 may be formed at the first depth Z1. The first thickness T1 may be from about 100 nm to about 200 nm. If the first thickness T1 is less than 100 nm, confining a light guide may be difficult, and thus, light leakage may occur. The second thickness T2 may be from about 0.5 μm to about 3 μm.

Figure 4C:
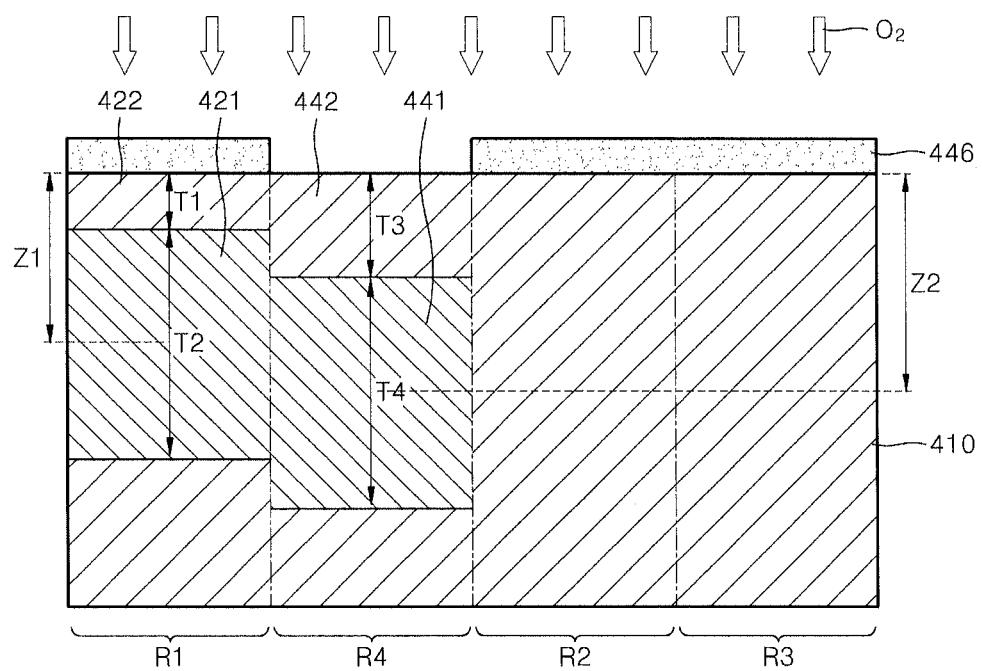

Referring to FIG. 4C, after the first pattern 426 is removed, a second photoresist layer (not shown) having a thickness from about 1 μm to about 20 μm is formed onto the silicon substrate 410. The thickness of the second photoresist layer may vary according to photoresist materials. The thickness of the second photoresist layer may be sufficient to prevent or inhibit oxygen ions from being transmitted through the second photoresist layer in an oxygen implantation operation described below.

A second pattern 446 may be formed by performing a common photographic etching on the second photoresist layer. The second pattern 446 may be formed to expose a second optical device region R4 and cover the first optical device region R1, an electronic device region R2, and an MEMS region R3.

Oxygen ion implantation may be performed on the second pattern 446 by using an ion implanter. A second ion implantation layer 441 may be formed in a portion of the silicon substrate 410, on which the second pattern 446 is not formed, at a second depth Z2 from a surface of the silicon substrate 410. Conditions for the ion implantation may include an energy value from about 1 KeV to about 100 KeV and an oxygen ion concentration from about $1\times10^{17}$ cm$^{-2}$ to about $1\times10^{19}$ cm$^{-2}$.

In the second optical device region R4, a second silicon epitaxial layer 442 having a third thickness T3 may be formed from the surface of the substrate 410, and the second ion implantation layer 441 having a fourth thickness T4 may be formed at the second depth Z2 from the surface of the substrate 410. The third thickness T3 may be from about 300 nm to about 500 nm. If the third thickness T3 is greater than 500 nm, the volume of the light guide increases, and thus, a size of an optical device also increases. The fourth thickness T4 may be from about 0.5 μm to about 3 μm.

Figure 4D:
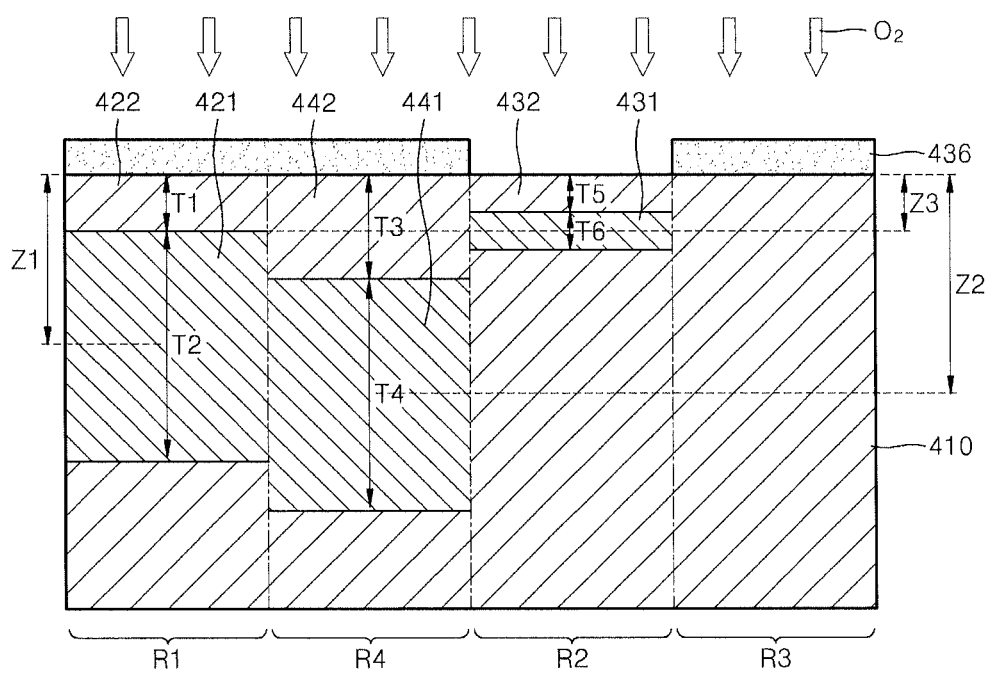

Referring to FIG. 4D, after the second pattern 446 is removed, a third photoresist layer (not shown) having a thickness from about 1 μm to about 20 μm is formed onto the silicon substrate 410. The thickness of the third photoresist layer may vary according to photoresist materials. The thickness of the third photoresist layer may be sufficient to prevent or inhibit oxygen ions from being transmitted through the second photoresist layer in an oxygen implantation operation described below.

A third pattern 436 may be formed by performing a common photographic etching on the third photoresist layer. The third pattern 436 may be formed to expose the electronic device region R2 and cover the first and second optical device regions R1 and R4 and the MEMS region R3.

Oxygen ion implantation may be performed on the third pattern 436 by using an ion implanter. A third ion implantation layer 431 may be formed in a portion of the silicon substrate 410, on which the third pattern 436 is not formed, at a third depth Z3 from a surface of the silicon substrate 410. Conditions for the ion implantation may include an energy value from about 1 KeV to about 100 KeV and an oxygen ion concentration from about $1\times10^{17}$ cm$^{-2}$ to about $1\times10^{19}$ cm$^{-2}$.

In the electronic device region R2, a third silicon epitaxial layer 432 may be formed to have a fifth thickness T5 from the surface of the substrate 410, and the third ion implantation layer 431 having a sixth thickness T6 may be formed at the third depth Z3. The fifth thickness T5 may be from about 1 nm to about 100 nm. If the fifth thickness T5 is less than 1 nm, forming a channel path for electrons may be difficult. If the fifth thickness T5 is greater than 100 nm, parasitic capacitance may increase, and thus, high-speed operations of electronic devices may be difficult to perform. The sixth thickness T6 may be from about 5 nm to about 300 nm.

Figure 4E:
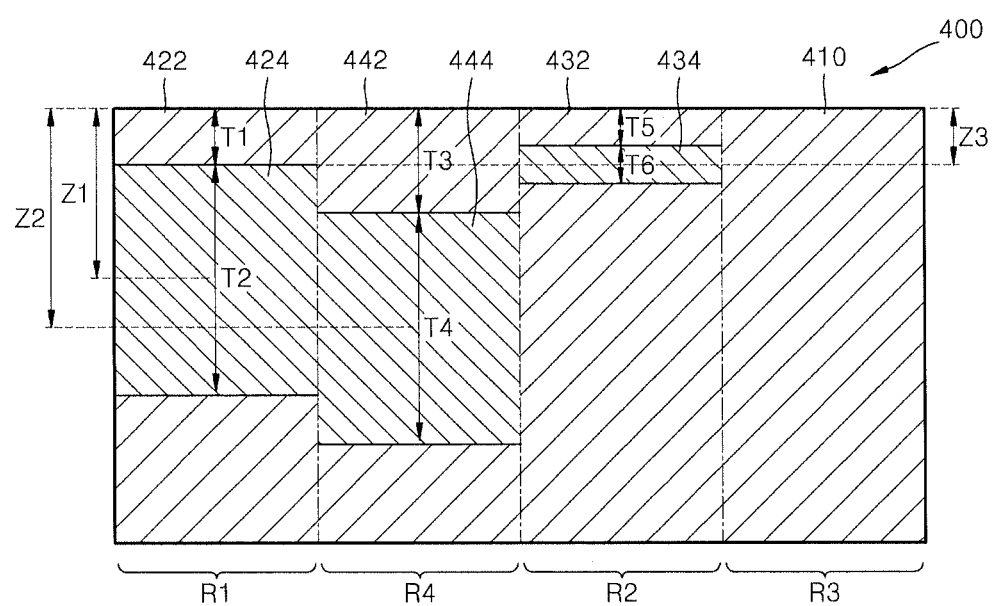

Referring to FIG. 4E, after the third pattern 436 is removed, the substrate 410 may be thermally treated. The thermal treatment may be formed at a temperature from 1200° C. to about 1500° C. for a period of time from about 10 minutes to about 5 hours. During the thermal treatment, the first ion implantation layer 421, the second ion implantation layer 441, and the third ion implantation layer 431 may become a first silicon oxide film 424, a second silicon oxide film 444, and a third silicon oxide film 434, respectively. The first, third, and second silicon oxide films 424, 434, and 444 correspond to the first, third, and second silicon buried oxide layers 224, 234, and 244 of FIG. 2, respectively. No buried oxide layer may be formed in a portion of the substrate 410 to which ions are not implanted, i.e., the MEMS region R3.

Although the method described above includes formation of the first ion implantation layer 421, the second ion implantation layer 441, and the third ion implantation layer 431 in the order stated, example embodiments are not limited thereto. For example, the second ion implantation layer 441 or the third ion implantation layer 431 may be formed before the first ion implantation layer 421 is formed.

The optoelectronic integrated circuit substrate 400 provides the first optical device regions R1 and R4 for desirable formation of optical devices, the electronic device region R2 for desirable formation of electronic devices, and the MEMS region R3 without a buried oxide layer which interferes with the formation of an MEMS structure.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. An optoelectronic integrated circuit substrate comprising:
   a first region and a second region, the first region including a buried insulation layer having a first thickness and the second region including a buried insulation layer having a second thickness different from the first thickness;
   optical devices on the first region; and
   electronic devices on the second region,
   wherein the buried insulation layer of the first region is thicker than the buried insulation layer of the second region, the buried insulation layer of the first region has a thickness from about 0.5 μm to about 3 μm at a depth from about 100 nm to about 500 nm from a top surface of the optoelectronic integrated circuit substrate, and the buried insulation layer of the second region has a thickness from about 5 nm to about 300 nm at a depth from about 1 nm to about 100 nm from the top surface of the optoelectronic integrated circuit substrate.

2. The optoelectronic integrated circuit substrate of claim 1, further comprising a third region having no buried insulation layer.

3. The optoelectronic integrated circuit substrate of claim 2, wherein a micro-electromechanical systems (MEMS) structure is formed in the third region.

4. The optoelectronic integrated circuit substrate of claim 1, wherein at least one of the buried insulation layer of the first region and the buried insulation layer of the second region is formed through implantation of at least one selected from a group consisting of oxygen, nitrogen, and neon.

5. The optoelectronic integrated circuit substrate of claim 1, wherein a top surface of the buried insulation layer of the first region and a top surface of the buried insulation layer of the second region are at different heights in a vertical direction.

6. The optoelectronic integrated circuit substrate of claim 1, wherein a top surface of the buried insulation layer of the first region is at a lower height than a top surface of the buried insulation layer of the second region.

7. The optoelectronic integrated circuit substrate of claim 1, further comprising:
   a fourth region including a buried insulation layer formed at a first depth, wherein the buried insulation layer of the first region is formed at a second depth less than the first depth.

8. The optoelectronic integrated circuit substrate of claim 7, wherein the buried insulation layer of the first region is located from about 100 nm to about 200 nm from the top surface of the optoelectronic integrated circuit substrate, and
the buried insulation layer of the fourth region is located from about 300 nm to about 500 nm from the top surface of the optoelectronic integrated circuit substrate.

9. The optoelectronic integrated circuit substrate of claim 7, wherein the first region and the fourth region are optical device regions.

10. The optoelectronic integrated circuit substrate of claim 1, wherein the optoelectronic integrated circuit substrate includes one of a conductive polymer and a semiconductor selected from a group consisting of silicon, gallium arsenide, and indium phosphide.

* * * * *